May 14, 1968 P. A. RAGARD 3,383,022

INSERTION MACHINE

Filed April 22, 1966 4 Sheets-Sheet 1

INVENTOR
PHILLIP A. RAGARD

BY Fidelman & Wolffe
ATTORNEYS

INSERTION MACHINE

Filed April 22, 1966

INVENTOR
PHILLIP A. RAGARD

BY Fidelman & Wolffe
ATTORNEYS

INVENTOR
PHILLIP A. RAGARD
BY Fidelman & Wolffe
ATTORNEYS

INVENTOR
PHILLIP A. RAGARD
BY
Fidelman & Wolffe
ATTORNEYS

United States Patent Office
3,383,022
Patented May 14, 1968

3,383,022
INSERTION MACHINE
Phillip A. Ragard, Binghamton, N.Y., assignor to Universal Instruments Corporation, Binghamton, N.Y., a corporation of New York
Filed Apr. 22, 1966, Ser. No. 544,552
17 Claims. (Cl. 227—114)

ABSTRACT OF THE DISCLOSURE

A machine for inserting into a circuit board the leads of an electrical component characterized by a body portion and a plurality of leads extending from one surface thereof, which comprises an inserter having inserting means adapted to be reciprocated between a component pick-up and insertion position; a component supporting assembly including a pair of pivotally mounted blocks adapted to support a component in pick-up position and be pivoted away from component supporting position after the component is picked up by the inserting means to permit the inserting means to pass between the blocks and insert the leads of the picked up component into the board; and a component supply means adapted to feed components one at a time onto the blocks when in component supporting position.

The present invention relates to a machine for inserting electrical components, each having a plurality of leads extending from one surface thereof, into a circuit board. More particularly, the present invention is directed towards an insertion machine which is primarily designed to handle electrical components, such as modules, which are characterized by a design in which one or more parallel rows of leads extend from one surface of a component body portion; certain of the leads having enlarged portions for the purpose of spacing the components from the board into which they are inserted.

The present invention is directed towards improvements in a component inserting machine of the type disclosed in copending application, Ser. No. 389,927, filed Aug. 17, 1964, and now Patent No. 3,254,821, issued June 7, 1966.

In the insertion machine described in Patent No. 3,254,821, there is provided an inserter having a reciprocal and rotatable inserting means adapted to insert components into a circuit board in various angular orientations, a component supporting assembly adapted to support a component in position to be picked up by the inserting means during reciprocation thereof, and a component supply adapted to supply components of the same angular orientation one at a time to the component supporting assembly. In one of the embodiments of the supporting assembly disclosed, a component support is adapted to be reciprocated normal to the path of motion of the inserting means once during each reciprocation thereof in order to withdraw a component from the component supply and convey such component into a position from which it may be picked up by the inserting means. In a second embodiment, the component support is stationary with respect to the axis of reciprocation of the inserting means, and a pair of reciprocating spring fingers are provided to pick up the component from the component supply and thereafter place such component on the component support.

While the machine of the Patent No. 3,254,821, represents a substantial improvement over other inserting machines presently available, it suffers the disadvantage of having a relatively complex, and thus expensive, component supporting assembly. Further, the several embodiments of the supporting assembly, which require a component be picked up adjacent to the outlet of the component supply and be subsequently transferred to a relatively remote pre-insertion position, restricts the operational speed of the machine.

Accordingly, it is an object of the present invention to provide an improved component supporting assembly which reduces the complexity and increases the speed of operation of a component inserting machine of the type described in Patent No. 3,254,821.

A further object of the present invention is to provide a component supply adapted for use with the improved component supporting assembly of the present invention.

It is also an object of the present invention to provide an insertion machine which is particularly adapted to accommodate and insert modules of varying sizes and shapes, which are each characterized by a body portion and one or more parallel rows of spaced leads extending from one surface of the body portion; the first and last leads of the first and last of the rows of leads having if desired enlarged portions disposed adjacent the one surface for the purpose of spacing the body portion from a circuit board into which the component is inserted.

Other objects and the nature and advantages of the present invention will be apparent from the following description taken in conjunction with the accompanying drawings, wherein.

Figure 1:
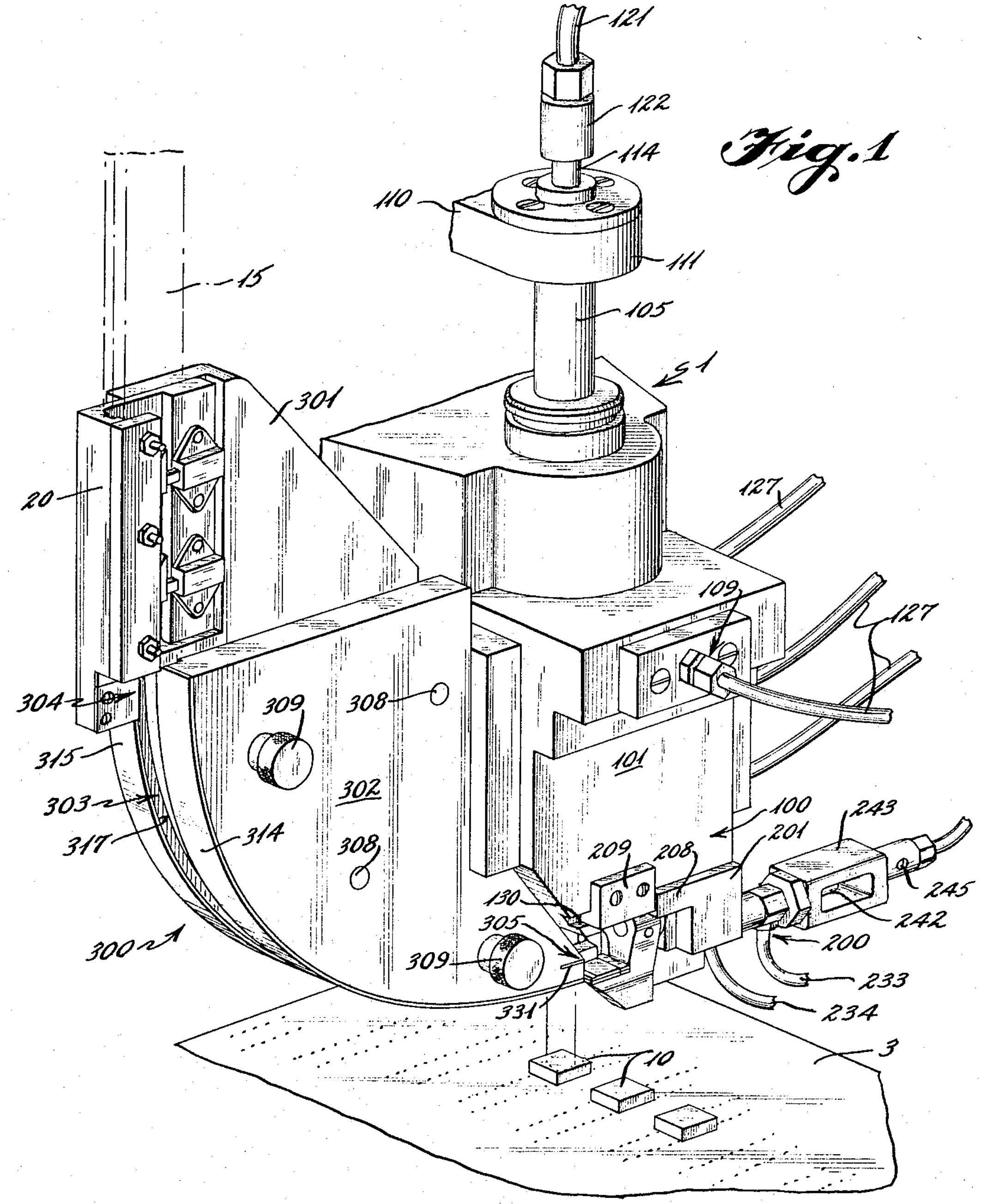
FIG. 1 is a perspective view illustrating the positioning of the several major elements of the insertion machine of the present invention.

The insertion machine of the present invention, generally designated as 1, is shown in FIG. 1 as including a component inserter, indicated as 100; a component supporting assembly, indicated as 200; and a component supply, indicated as 300.

It will be understood that inserter 100 and component supply 300 are mounted by any suitable means, not shown, on a machine mounting bracket 2. Bracket 2 is employed to position the illustrated elements of the machine with respect to a support means, not shown, for a circuit board 3 and the fluid and electrical controls of the machine, also not shown. The manner of operation of the present machine will be apparent from the following discussion, and thus it is deemed unnecessary to discuss the specific design of the fluid and electrical controls, which form no part of the present invention. However, where appropriate and deemed desirable to more fully understand the present invention, reference will be made to the controls disclosed in Patent No. 3,254,821.

It will be apparent from viewing the accompanying drawings and the following description that the component supply 300 functions to sequentially convey electrical components 10, which are oriented at the same angular position, one at a time, from a magazine 15, enclosed in a magazine receiver 20, onto the component supporting assembly 200. The inserter 100 is employed to pick up a supported component from assembly 200 and thereafter selectively reorient and insert the leads of such component into circuit board 3. A suitable mechanism, not shown, may be disposed beneath circuit board 3 for the purpose of clinching the free ends of the component leads which project through the circuit board.

Figure 11:
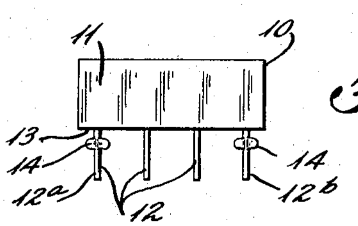
FIG. 11 is an enlarged view of the module for which the machine of the present invention is particularly adapted for use.

The insertion machine of the present invention is particularly adapted to insert modules of the type shown in solid lines in FIGS. 1 and 11, which include a body portion 11 in the form of a rectangular solid and one or more rows of parallel leads 12 extending from one surface 13 of the body portion. It will be understood that at least the first and last leads of the first and last rows of leads 12A, 12B are deformed or provided with an enlarged portion 14 disposed adjacent to the body portion 13 for the purpose of spacing the module from the surface of circuit board 3. Modules 10 are characteristically formed by "potting" in plastic a silicone chip having an integrated circuit printed thereon. However, if desired, the insertion machine of the present invention may be employed to insert conventional transistors.

INSERTER

Figure 2:
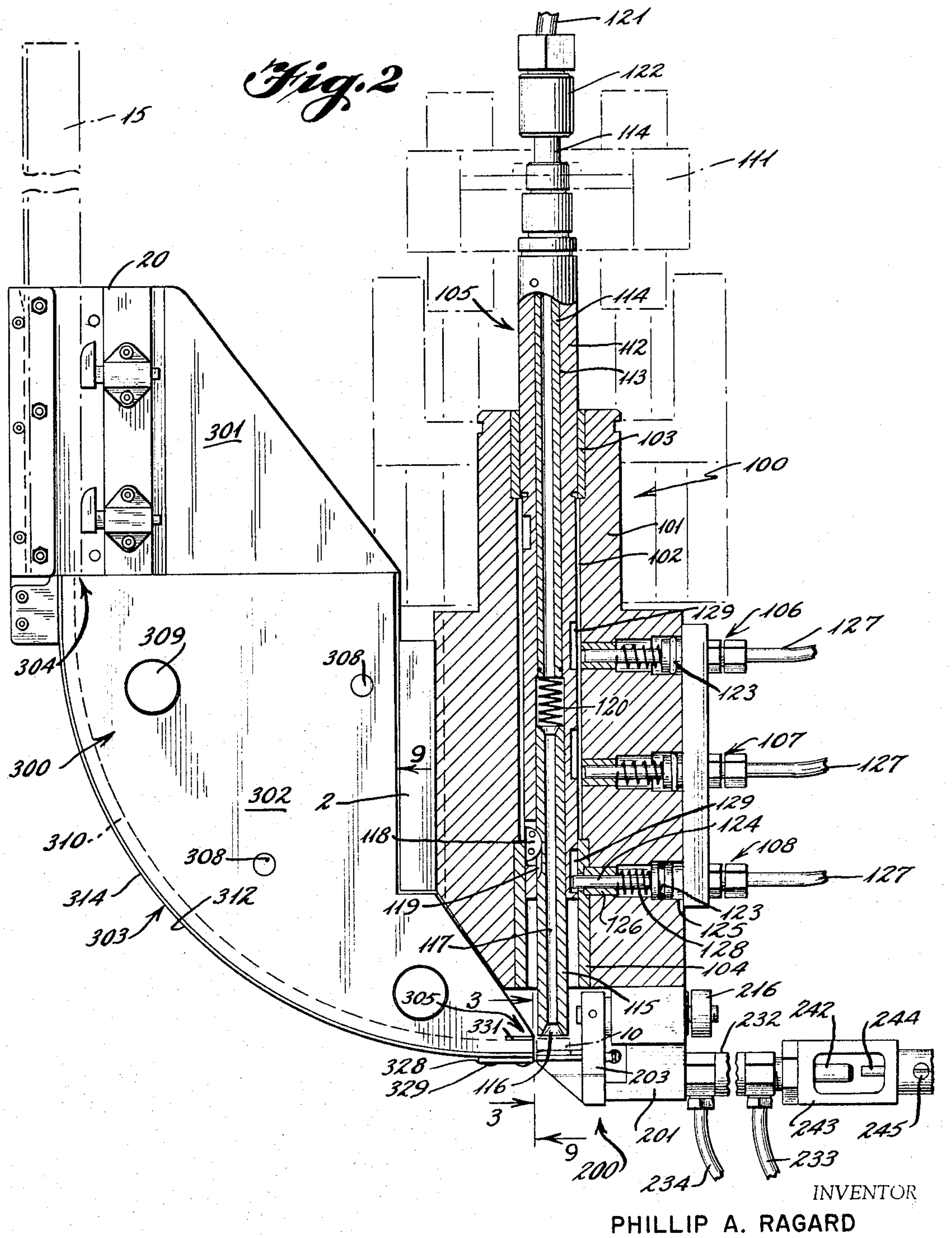
FIG. 2 is a fragmentary front elevational view of the machine illustrated in FIG. 1, but showing the inserter in section.

The overall structure and mode of operation of inserter 100, illustrated in FIGS. 1 and 2, is similar to that described and claimed in Patent No. 3,254,821. As shown, inserter 100 comprises, in part, a stationary inserter body 101 having a vertically extending cylindrical bore 102, which is provided with upper and lower concentrically disposed sleeve bearings 103 and 104; an inserter tube, generally shown as 105, which is slidably and rotatably supported within bearings 103 and 104; and fluid operated cam control elements 106, 107, 108 and 109 which are supported in inserter body 101 and employed to selectively control the degree of rotation of inserter tube 105, during reciprocation thereof.

It will be understood that insertion tube 105 is reciprocated within the bore 102 by a vertically reciprocating member 110 for motion between a relatively retracted position, shown in FIG. 2, to an extended component inserting position, not shown. Member 110 may be operated by any suitable means such as a fluid control cylinder not shown. Insertion tube 105 is connected to member 110 by means of a driving block 111 in which the insertion tube 105 is journalled to permit rotation thereof with respect to member 110.

Referring particularly to FIG. 2, it will be seen that insertion tube 105 comprises an outer guide tube 112 having a longitudinally extending bore 113; a vacuum tube 114, which is received within the upper end of bore 113 and keyed for movement with the guide tube; and a component pick up head 115, which is slidably received within the lower end of bore 113. Pick up head 115 is provided at its lower end with an orifice 116 and a connecting passageway 117 disposed in fluid communication with vacuum tube 114. Suitable means, such as key 118 and slot 119, are provided to prevent relative rotation and control the extent of axial movement between guide tube 112 and pick up head 115. A coil spring 120 is disposed in bore 113 between vacuum tube 114 and pick up head 115 and is employed to resiliently bias the pick up head downwardly, as viewed in FIG. 2, with respect to guide tube 112. It will be understood that spring 120 permits pick up head 115 to be slightly retracted within guide tube 112 when the latter is in both component pick up and insertion position.

Vacuum tube 114 is shown as extending upwardly through the driving block 111 and as being connected to a flexible vacuum conduit 121 by means of a suitable fitting 122. Fitting 122 is constructed so as to provide fluid communication between tube 114 and conduit 121 and to permit relative rotation therebetween.

The control elements 106–109 are of identical construction and, as shown particularly in FIG. 2, include a fluid operated piston 123 which is provided at one end with a projecting cam finger 124. The piston 123 and cam finger 124 are slidably supported, respectively, within a cylindrical bore 125 and a sleeve bearing 126 provided in inserter body 101, for reciprocating motion radially with respect to bore 102. It will be apparent that fluid pressure may be applied to pistons 123 of control elements 106–109 through ducts 127 and employed to force pistons 123 and thus cam fingers 124 to the left, as shown in the case of element 108 in FIG. 2, against the bias of springs 128, and that upon the venting of ducts 127, springs 128 will return pistons 123 to their original position.

As more fully described in Patent No. 3,254,821, the outer surface of guide tube 112 is provided with four dissimilarly shaped cam slots 129, only three being shown in FIG. 2, which are adapted to cooperate with corresponding cam fingers 124 to selectively control the degree of rotation of insertion tube 105 during reciprocation thereof.

One of cam slots 129, e.g. the one associated with control element 109, extends vertically in alignment with the axis of reciprocation of guide tube 112 and functions to prevent rotation of tube 112 during reciprocation thereof, whereby a component is inserted in the same angular orientation at which it is supplied to the supporting assembly 200. The remaining cam slots 129, e.g. those associated with control elements 106–108, are characterized by vertically extending upper and lower portions, which are spaced circumferentially of tube 112, and an inclined middle portion; the degree of inclination of the middle portion of the respective cam slots being varied so as to permit a component picked up by head 115 to be selectively reorientated through angles of, for instance, 30 and 45 and 90 degrees. It will be understood that the design of the cam slots 129, associated with control elements 106–108, prevents rotation of guide tube 112 during the component pick up and insertion portions of tube travel.

SUPPORTING ASSEMBLY

Figure 3:
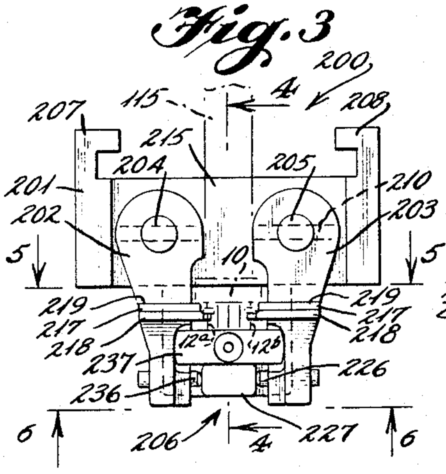
FIG. 3 is an elevational view taken generally along line 3—3 of FIG. 2, showing the pivot blocks in component supporting position.
Figure 5:
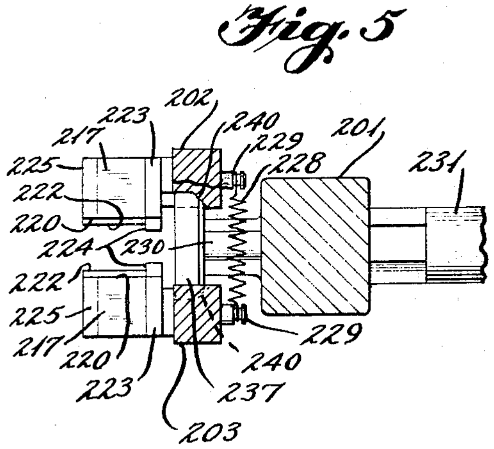
FIG. 5 is a sectional view taken generally along the line 5—5 of FIG. 3, but having parts broken away to show a pivot block cam follower surface.
Figure 6:
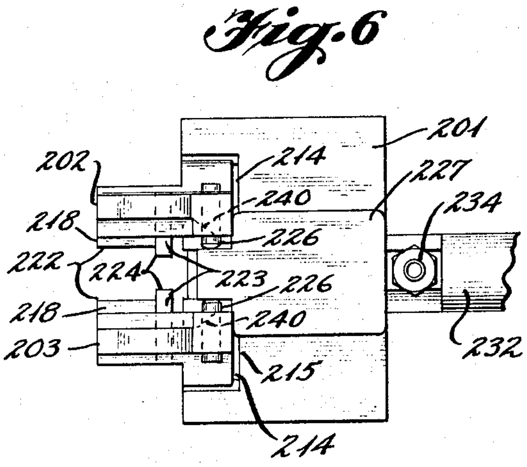
FIG. 6 is a bottom plan view taken along line 6—6 of FIG. 3.
Figure 7:
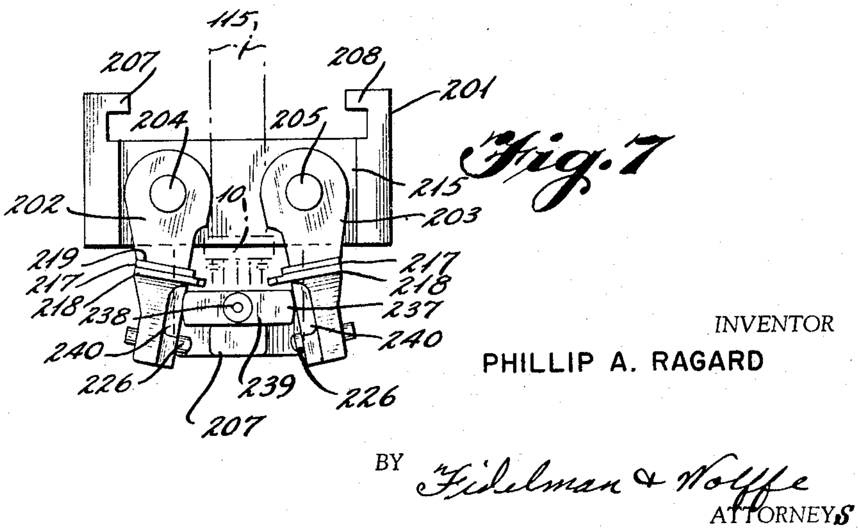
FIG. 7 is a view similar to that of FIG. 3, but showing the pivot blocks moved apart to permit passage of the component pick up head therebetween.

The component supporting assembly 200 is shown in FIGS. 1 through 7 as including a mounting block 201; a pair of pivot blocks 202, 203, which are pivotally supported on mounting block 201 by spaced parallel pivot shafts 204, 205; and means, generally indicated as 206, adapted to force blocks 202, 203 from the component supporting position illustrated in FIG. 3 to the position illustrated in FIG. 7.

As shown particularly in FIGS. 1 and 3, assembly 200 is mounted on inserter body 101 by means of a pair of oppositely disposed flanges 207, 208, which are formed integrally with mounting block 201 and adapted to be slidably received within a pair of inserter body guide slots 130, only one of which is shown in FIG. 1. Mounting flanges 207, 208 may be adjustably locked in position within slots 130 by any suitable means, indicated at 209, to maintain a desired spacing between assembly 200 and component supply 300.

Figure 4:
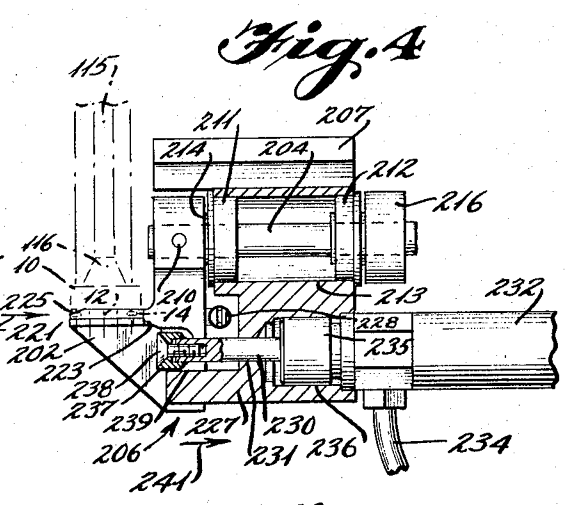
FIG. 4 is a sectional view taken generally along the line 4—4 of FIG. 3, but having parts broken away to show a pivot block bearing support.

FIGS. 3 and 4 show pivot blocks 202, 203 in position to receive and support a component 10, shown in phantom, in vertical alignment with orifice 116 of the component pick up head 115, also shown in phantom. It will be seen that pivot blocks 202, 203 are keyed, as at 210, for rotation with pivot shafts 204, 205, and that pivot shafts 204, 205 are journalled within bearings 211, 212, carried within mounting block bore 213. Suitable means, such as discs 214, are employed to space pivot blocks 202, 203 from face 215 of mounting block 201, and locking means, generally indicated at 216, are provided to prevent reciprocation of pivot shafts 204, 205 with respect to bearings 211, 212.

As shown particularly in FIGS. 3, 4, and 5, pivot blocks 202, 203 are provided with component supporting plates 217 and component lead restraining plates 218. Preferably, plates 217 and 218 are removably or adjustably affixed to pivot blocks 202, 203 by any suitable means to permit accommodation of components of varying sizes. It will be understood that when pivot blocks 202, 203 are in component supporting position, as illustrated in FIG. 3, the upper surfaces to 219 of supporting plates 217 are disposed in a relatively spaced planar relationship and are adapted to supportingly engage surface 13 of component body portion 11 along opposed marginal edges thereof. Opposed edges 220 of plates 217 are spaced apart a distance sufficient to permit enlarged portions 14 of leads 12 to be freely received therebetween when a component 10 is forced onto pivot blocks 202, 203 in the direction indicated by arrow 221 in FIG. 4. Referring to FIGS. 3 and 5, it will be seen that opposed edges 222 of restraining plates 218 are spaced inwardly of edges 220 of the supporting plates 217 and are adapted to releasably engage the leads of rows 12A, 12B at a point between enlarged portion 14 and the downwardly extended free ends of leads 12. The thickness of support plates 217 is such that lateral contact between lead enlarged portions 14 and restraining plates 218 is prevented.

Referring particularly to FIGS. 4 and 5, it will be seen that additional restraining plates 223 are provided on one each of pivot blocks 202, 203 and are adapted to extend into the space between the blocks. Edge surfaces 224 of plates 223 are adapted to releasably engage at least the last lead of lead rows 12A and 12B. The additional restraining means may be fixed to pivot blocks 202, 203 by any suitable means, or if desired, formed integrally therewith or integrally with restraining plates 218.

From the foregoing, it will be apparent that when component 10 is fed onto pivot blocks 202, 203, when the blocks are in position shown in FIG. 3, edges 222 of restraining plates 218 slidably engage the leads of rows 12A, 12B to prevent motion of component 10 transversely of supporting plates 217 and that edges 224 of additional restraining means 223 act as a stop to limit motion of component 10 in a direction towards surface 215 of mounting block 201. Passage of a component onto pivot blocks 202, 203 from the supply 300 is facilitated by ramp guide surfaces 225, which are shown as being formed by tapering the edges of plates 217 adjacent to the supply 300.

Now referring to FIGS. 3 and 6, it will be seen that when the pivot blocks are in component supporting position, abutment means 226, which are carried on each pivot block, are adapted to be in engagement with opposite sides of an abutment 227, formed integrally with mounting block 201. Abutments 226 are preferably screw threaded to permit adjustment thereof to insure the planar relationship of component supporting surfaces 219. A coil spring 228, which is carried at each end thereof on pivot block pins 229, is employed to normally bias abutments 226, 227 into engagement.

In FIG. 4 the means 206 employed to pivot blocks 202, 203 from component supporting position is illustrated as including a plunger 230, which is slidably supported within bore 231 of mounting block 201. Plunger 230 is adapted to be reciprocated between extended and retracted positions, by fluid introduced into the ends of a drive cylinder 232 through conduits 233 and 234, respectively. If desired, plunger 230 may be provided with an enlarged sleeve portion 235, which is slidably received within mounting block enlarged bore opening 236 and employed to limit the extent of motion of plunger 230 to the left as viewed in FIG. 4.

Referring particularly to FIGS. 3, 4 and 7, it will be seen that the forwardly extending end of plunger 230 is provided with a cam member 237 affixed thereto by any suitable means, such as screw 238. Rotation of cam 237 about the axis of plunger 230 is prevented during reciprocation of the plunger by causing cam 237 to slide in surface engagement with the upper surface 239 of mounting block abutment 226.

As shown in FIGS. 4, 5 and 7 pivot blocks 202, 203 are provided with opposed cam follower surfaces 240, which are adapted to be operably engaged by the rearwardly facing portion of the cam 237. Thus, it will be appreciated that when plunger 230 is retracted in the direction indicated in FIG. 4 by arrow 241, the cam 237 is caused to slidably engage cam follower surfaces 240 and thereby pivot blocks 202, 203 into the position indicated in FIG. 7 against the bias of spring 228. With plunger 230 in its retracted position and supporting and restraining plates 217, 218 moved apart as indicated in FIG. 7, sufficient room is provided between pivot blocks 202, 203 to permit pick up head 115 to pass downwardly therebetween for the purpose of inserting a component into circuit board 3. Upon venting of duct 234 and the introduction of pressurized fluid into duct 233, plunger 230 is forced to its extended position whereby permitting spring 228 to return pivot blocks 202, 203 to the components supporting position illustrated in FIG. 3.

Referring to FIG. 2, it will be seen that the rearwardly extending end 242 of plunger 230 is adapted to project through the rear wall of cylinder 232 into an adjustment viewing device 243. Device 243 includes an adjustment pin 244 which is adapted to be adjustably positioned axially of plunger 230 by any suitable means, such as adjustment screw 245. It will be understood that by moving adjustment pin axially of plunger 230 the fully retracted position of plunger 230 is adjusted, and thus the spacing between pivot blocks 202, 203 when in open position may be controlled. This feature permits the machine of the present invention to be readily adjusted to accommodate components of varying size and configuration.

The supply assembly 300 is shown in the drawings as including a mounting plate 301, by which the assembly is affixed to machine bracket 2; a front plate 302, which is mounted on and in spaced relationship to mounting plate 301; chute means, which is generally indicated as 303 and adapted to support and guide components sequentially from a supply inlet 304 to a supply outlet 305; feed means which is generally indicated as 306 and adapted to force components through chute 302; and escapement means, generally indicated at 307. Magazine receiver 20 is shown for purposes of illustration as being supported on mounting plate 301 so as to permit components from magazine 15 to pass downwardly into supply inlet 304. The magazine and mounting therefore, however, form no part of the present invention.

Front plate 302 is removably mounted on mounting plate 301 by any suitable means, such as spacing pins 308; two of which extend through face plate 302 and are provided with threaded locking caps 309. As will be readily apparent the spacing between mounting plate 301 and front plate 302 may be varied to accommodate various size components.

Figures 8, 9, 10:
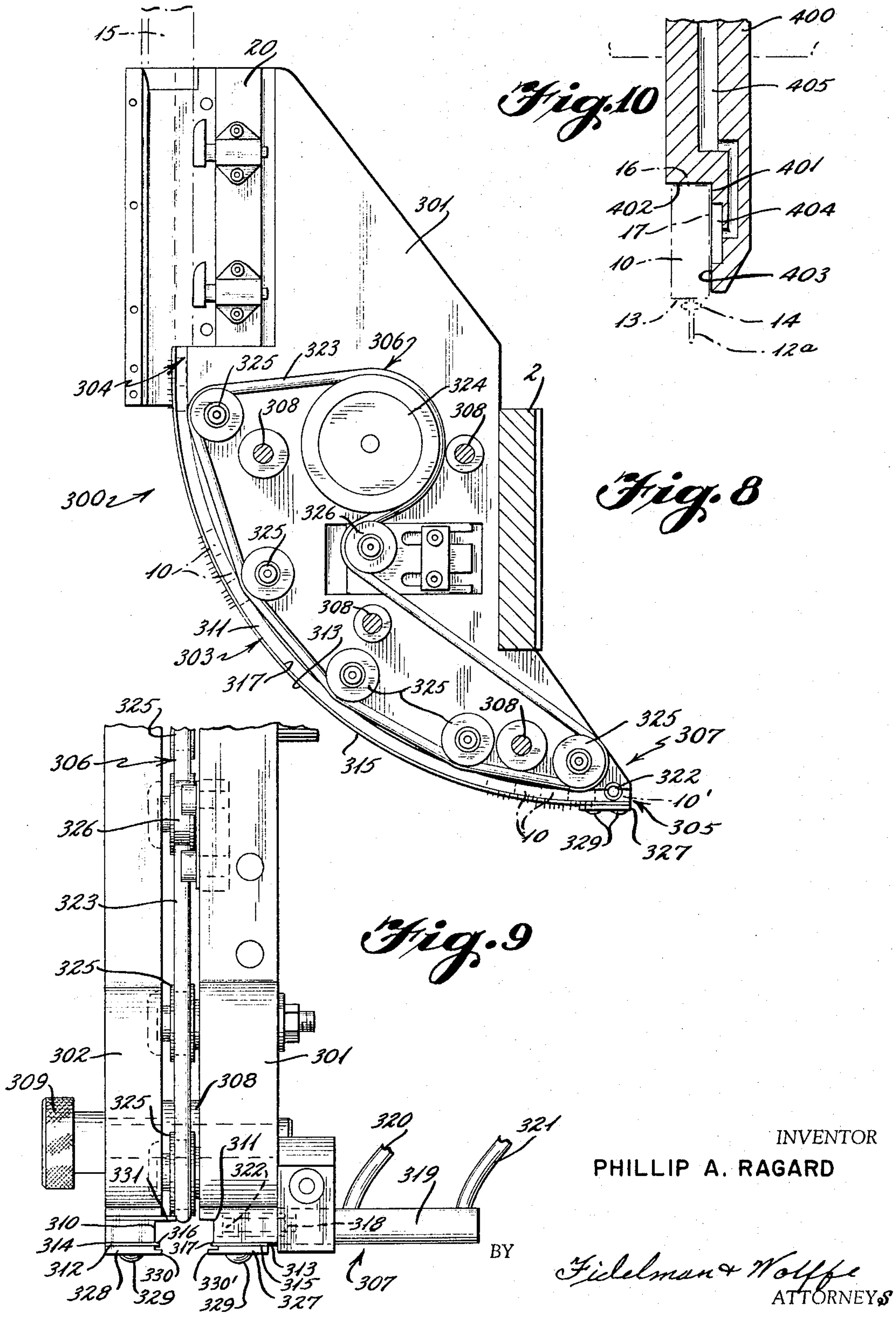
FIG. 8 is a front elevational view of the component supply and magazine receiver, with the component supply front face plate removed.
FIG. 9 is an elevational view taken generally along the line 9—9 of FIG. 2.
FIG. 10 is a fragmentary vertical sectional view showing a modifiaction of the component pick up head illustrated in FIG. 2.

Referring particularly to FIGS. 8 and 9, chute 303 is shown as being defined by downwardly opening side recesses 310, 311, provided in the curved edge walls 312, 313 of mounting plate 301 and face plate 302, respectively, and by a pair of curved guide plates 314, 315 which are secured to curved side walls 312, 313, respectively, by any suitable means, not shown. By viewing FIGS. 8 and 9, it will be apparent that components 10 are sequentially passed in alignment from supply inlet 304 and outlet 305 and during such passage opposed marginal edges of surface 13 of components 10 are adapted to be supported in sliding engagement with the upwardly facing surfaces 316, 317 of guide plates 314, 315, respectively. It will also be understood that the distance between guide plates 314, 315 is sufficient to permit the depending leads 12 and lead enlarged portions 14 of components 10 to freely pass downwardly between the plates.

The escapement means 307 includes a reciprocating plunger 318 which is adapted to be forced between extended and retracted positions by pressurized fluid introduced into the ends of control cylinder 319 through ducts 320 and 321, respectively. It will be understood that when piston 318 is forced into extended position, i.e., to the left as viewed in FIG. 9, that a friction brake surface 322 carried on plunger 318 is adapted to be forced into surface engagement with a component 10′ disposed at the supply outlet 305. Plunger 318 is normally maintained in its extended position, but is adapted to be retracted once during each reciprocation of component pick up head 115 to permit feeding means 306 to force component 10′ onto pivot blocks 202, 203, when the blocks are in the position illustrated in FIG. 3. It will be understood that the electrical and pneumatic controls for controlling operation of escapement 307 may be similar to those disclosed in Patent No. 3,254,821.

The component feeding means 306 includes a flexible drive member 323, which may be in the form of an O-ring belt; a pulley 324, which is driven by any means, not shown, and employed to continuously drive member 323; and a plurality of mounting plate supported, freely rotatable pulleys 325 which are employed to guide member 323 into frictional surface engagement with at least some of the components supported within chute 303. It has been found desirable to pass member 323 in surface engagement with only a portion of the components supported within chute 303 in order to reduce wear of drive member 323 and the power necessary to drive pulley 324. No difficulty has been encountered in maintaining the rate of feed of components through chute 303 between guide pulleys 325, since the components are at all times under the influence of gravity and are forced towards outlet 305 by succeeding components. If desired, a movably supported pulley 326 may be provided to adjust tension in driving member 323.

As shown particularly in FIG. 9, component lead guide plates 327, 328 are affixed by any suitable means, such as screws 329, to guide plates 314, 315, respectively, at a point adjacent outlet 305. Guide plates 327, 328 are provided with opposed side edges, 330′, 330 which are aligned with edges 222 of restraining plates 218, and in a like manner function to engage the leads 12 of rows 12A, 12B at a point between lead enlarged portion 14 and the free ends of the leads. It will be appreciated that by this construction the leads 12 of components 10 are exposed to sliding, frictional surface engagement only during a relatively small portion of chute travel, thus reducing the possibility of damages thereto. An auxiliary guide plate 331 is affixed to front plate 302 and adapted to project into the space between the front and mounting plates at a point adjacent to the supply outlet 305. Plate 331 is employed to prevent jumping or excessive vertical movement of component 10′ upon actuation of escapement 307, which might effect proper feeding of component 10′ onto pivot blocks 202, 203.

FIG. 10 illustrates a modified component pick up head 400 which is particularly adapted for use with modules having an upper surface 16 which is too small to permit proper engagement with the vacuum orifice 116 of the pick up head 115, illustrated in FIG. 2. Pick up head 400 is provided adjacent its lower end with a vertically extending side recess 401, which is defined by horizontally disposed top wall 402 and a vertically disposed side wall 402. The vertical dimension of side wall 403 is not greater than that of the vertical side wall 17 of body portion 11. Side wall 403 is provided with a centered orifice 404 which is in communication with vacuum passageway 405 provided in the pick up head 400. If desired the lower orifice containing ends of the pick up heads 115 and 400 may be screw threaded to the upper ends thereof to permit the pick up heads illustrated in FIGS. 2 and 10 to be readily interchanged.

In explaining the operation of the machine of the present invention, it will be assumed that at the start of each cycle of operation, a component 10 is supported on supporting assembly 200, the pick up head 115 is in its upper or retracted position, the plunger 318 of the escapement means 307 is extended to arrest a component 10′ adjacent to the outlet 305 of the supply 300, and feeding means 306 is powered thereby tending to force component 10′ outwardly through outlet 305. Initially, one of the control elements 106–109 is selectively actuated depending upon the degree of reorientation of the inserted component desired. Thereafter, driving block 111 is reciprocated to force pick up head 115 downwardly into engagement with the upper surface of component 10, at which point conduit 121, tube 114, passageway 117 and orifice 116 are placed in communication with a source of vacuum whereby component 10 is picked up and retained on pick up head 115. Immediately following pick up of component 10 conduit 233 is vented and conduit 234 is subjected to pressurized fluid to retract plunger 230 and thus pivot blocks 202, 203 from component supporting position. Upon continued downward movement of pick up head 115, the pick up head is rotated, as determined by which of the control elements 106–109 has been actuated, to reorient component 10; the leads 12 of component 10 being thereafter inserted into circuit board 3 and clenched. Suitable switching means thereafter act to vent conduit 121 to release the thus inserted component, and cause drive block 111 to return pick up head 115 to upper retracted position. Following this operation, suitable switching means are employed to vent conduit 234 and connect conduit 233 to a source of fluid pressure, thereby causing plunger 230 to be reciprocated into its extended position where upon spring means 228 biases the pivot blocks 202, 203 back into component supporting position. At this point the escapement 307 is actuated to momentarily retract plunger 318 to permit the continuously driven member 323 to force component 10′ onto pivot blocks 202, 203 to complete one cycle of operation. The electrical and pneumatic controls employed with the escapement and inserter may be similar to those disclosed in Patent No. 3,254,821 and the pneumatic circuit employed to operate plunger 230 may be tied in with such circuits in any suitable manner. The modifications of the controls disclosed in Patent No. 3,254,821 to permit their use with the machine of the present invention are considered to be obvious to one skilled in the art, and thus form no part of the present invention.

It will be obvious to those skilled in the art that various changes may be made without departing from the spirit of the present invention and therefore the invention is not limited to what is shown in the drawings or described in the specification, but only as indicated in the appended claims.

What is claimed is:

1. A machine for inserting leads of electrical components into a circuit board, said components having a body portion and a plurality of leads extending from one surface thereof, which comprises an inserter having a reciprocal component inserting means; means for reciprocating said inserting means; a component supporting assembly adapted to removably support a component in a predetermined position in alignment with the path of reciprocation of said inserting means to permit said inserting means to engage said component and insert the leads thereof into said board; and a component supply means, said supply means including means adapted to support and guide components to be inserted sequentially from an inlet of said supply means to an outlet thereof disposed adjacent said component supporting assembly, feed means tending continuously during operation of said machine to force components through said support and guide means and onto said component supporting assembly, escapement means disposed adjacent said outlet, and means adapted to actuate said escapement once during each reciprocation of said inserting means to permit said feed means to position one component at a time on said supporting assembly when said assembly is in said supporting position.

2. A machine for inserting leads of electrical components into a circuit board, said components having a body portion and a plurality of leads extending from one surface thereof, which comprises an inserter having a reciprocable component inserting means; means for reciprocating said inserting means; a component supporting assembly adapted to removably support a component in a predetermined position aligned with the path of reciprocation of said inserting means to permit said inserting means to engage said component and insert the leads thereof into said board; and a component supply means including in combination means adapted to support and guide components to be inserted sequentially from an inlet of said supply means to an outlet thereof disposed adjacent said component supporting assembly, feed means including a flexible drive member and means to guide said drive member into frictional surface engagement with the body portion of at least some of said components supported by said support and guide means, and escapement means disposed adjacent said outlet and adapted to be actuated once during each reciprocation of said inserting means to permit said drive member to position one component at a time onto said assembly when said assembly is in said supporting position.

3. A machine according to claim 1, wherein said feed means includes a flexible drive member, means to guide said drive member into frictional surface engagement with the body portion of at least some of said components supported by said support and guide means, said drive member being adapted to be continuously driven, whereby one component at a time is fed onto said assembly each time said escapement means is actuated.

4. A machine according to claim 2, wherein said support and guide means includes a pair of guide surfaces extending between said inlet and said outlet, said guide surfaces being adapted to supportingly engage said one surface of said components and said guide surfaces being spaced apart to permit passage of said leads of said components therebetween; first guide means disposed adjacent said outlet, said first guide means being adapted to slidably engage leads of said components adjacent said outlet only at a point spaced from said one surface to prevent motion of said components transversely with respect to said support and guide means; and second guide means disposed adjacent said outlet, said second guide means being adapted to slidably engage the body portion of said components when adjacent said outlet to prevent vertical movement of said components away from said guide surfaces.

5. A machine for inserting leads of electrical componetns into a circuit board, said components having a body portion and a plurality of leads extending from one surface thereof, which comprises an inserter having a reciprocable component inserting means, means for reciprocating said inserting means, a component supporting assembly adapted to removably support a component in a predetermined position aligned with the path of reciprocation of said inserting means to permit said inserting means to engage said component and insert the leads thereof into said board, and a component supply means, said supply means including in combination; a mounting plate, a front plate, means removably mounting said front plate upon said mounting plate in a spaced apart and parallel relationship, each of said plates having curved guide surfaces extending between an inlet and outlet of said supply means, said outlet being disposed adjacent to said assembly, said guide surfaces being adapted to supportingly engage aid one surface of said components and being spaced apart to permit passage of the leads of said components therebetween, whereby said components are sequentially passed in alignment from said inlet to said outlet and during passage thereof said leads are rotated from a generally horizontal position to a generally vertical position; means for feeding said components between said inlet and said outlet and onto said assembly, said feeding means including a flexible drive belt and means to guide said belt into frictional surface engagement with the body portion of at least some of said components supported on said guide surfaces, said belt being adapted to be continuously driven; escapement means, said escapement means being disposed adjacent said outlet and adapted to be actuated once during each reciprocation of said inserting means to permit said belt to feed one component at a time onto said assembly; and first and second guide means disposed adjacent to said outlet, said first and second guide means being adapted to slidably engage leads of said components at a point spaced from said one surface and the body portion of said components, respectively, thereby preventing transverse and vertical motion of said components adjacent to said outlet with respect to said guide surfaces.

6. A machine for inserting leads of electrical components having a body portion and a plurality of leads extending from one surface thereof, which includes an inserter having a reciprocal component inserting means, means for reciprocating said inserter means, a component supporting assembly adapted to removably support a component in a predetermined position in alignment with the path of reciprocation of said inserting means to permit said inserting means to engage said component and insert the leads thereof into said board, and component supply means adapted to support a plurality of components and to feed components one at a time onto said assembly when said assembly is in said supporting position, said assembly comprising, in part, a stationary mounting block; a pair of pivot blocks, said blocks being pivotally supported on said mounting block by a pair of spaced parallel pivot shafts; means adapted to normally maintain said pivot blocks in component supporting position, said pivot blocks having surfaces adapted to supportingly engage said one surface of a component supported thereon, said supporting surfaces being disposed in a laterally spaced apart planar relationship when said pivot blocks are in said component supporting position; and means adapted to force said pivot blocks from said component supporting position after said supported component is engaged by said inserting means to permit said inserting means to pass between said pivot blocks to insert the leads of said engaged component into said board.

7. A machine according to claim 6, wherein said forcing means includes a reciprocating plunger having cam means carried thereon, said pivot blocks are provided with cam follower surfaces which are adapted to be operatively engaged by said cam means, and said plunger is adapted to be reciprocated to move said cam means with respect to said cam surfaces, whereby said pivot blocks are pivoted from said component supporting position during reciprocation of said plunger.

8. A machine according to claim 7, wherein said forcing means also includes means to adjustably control the extent of reciprocation of said plunger, whereby the spacing between said pivot blocks when pivoted from said component supporting position may be varied.

9. A machine according to claim 6, wherein said pivot blocks are provided with restraining means adapted to releasably engage leads of said supported component, said restraining means being adapted to prevent motion of said supported component in at least three directions planar to said supporting surfaces.

10. A machine according to claim 6, wherein said pivot blocks are provided with ramp guides disposed along edges of said supporting surfaces adjacent said supply means, said ramps being adapted to guide components from said supply means onto said supporting surfaces.

11. A machine for inserting an electrical component into a circuit board, said component having a body portion and a plurality of leads extending from one surface thereto, said machine including, in part, an inserter having a reciprocal component inserting means, means for reciprocating said inserting means, and a component supporting assembly adapted to support a component in position to permit said inserting means to pick up said component during reciprocation thereof, said assembly comprising, in part, a stationary mounting block disposed adjacent the path of reciprocation of said inserting means; a pair of pivot blocks, said blocks being pivotally supported on said mounting block by spaced parallel pivot shafts; means adapted to normally maintain said pivot blocks in component supporting position, said pivot blocks having surfaces adapted to supportingly engage said one surface of a component supported thereon along at least opposed marginal edges thereof, said supporting surfaces being disposed in a laterally spaced apart planar relationship when said pivot blocks are in said component supporting position; and means adapted to force said pivot blocks from said component supporting position after said supported component is picked up by said inserting means to permit said inserting means to pass between said pivot blocks to insert said picked up component into said board.

12. A machine according to claim 11, wherein said forcing means includes a reciprocating plunger having cam means carried thereon, said pivot blocks are provided with cam follower surfaces which are adapted to be operably engaged by said cam means, and said plunger is adapted to be reciprocated in a direction to move said cam means with respect to said cam surfaces, whereby said pivot blocks are forced from said component supporting position during reciprocation of said plunger.

13. A machine according to claim 11, wherein the design of said component to be inserted is characterized by a body portion, one or more parallel rows of spaced leads extending from one surface of the body portion, and the first and last leads of the first and last of said rows of leads are provided with an enlarged portion disposed adjacent said one surface for the purpose of spacing said one surface from said board when the leads of said component are inserted therein, and said pivot blocks are provided with restraining means, said restraining means being adapted to releasably engage leads of at least said first and said last rows when said component is supported on said supporting surfaces at a point which is spaced from said one surface and disposed between said enlarged portion and the free ends of said leads to prevent motion of said supported component in the plane of said one surface in at least two directions.

14. A machine according to claim 11, wherein said means for maintaining said pivot blocks in component supporting position includes a first abutment means carried on said mounting block; second abutment means carried on said pivot blocks; and spring means, said spring means being adapted to bias said first and second abutments into engagement to normally maintain said pivot blocks in said component supporting position, said forcing means being adapted to pivot said pivot blocks from said component supporting position against the bias of the said spring means.

15. In a machine for inserting electrical components into a circuit board, the design of said component being characterized by a body portion, one or more parallel rows of spaced leads extending from one surface of the body portion, and at least the first and last leads of the first and last of said rows of leads having an enlarged portion disposed adjacent said one surface for the purpose of spacing said one surface from said board in component inserted position, the provision, in part, of an inserter having a reciprocal component inserting means; means for reciprocating said inserting means; and a component supporting assembly adapted to removably support a component in position to permit said inserting means to pick up said component during reciprocation thereof, said component supporting assembly including a pair of blocks having surfaces which when said assembly is in said component supporting position are disposed in a laterally spaced apart planar relationship and are adapted to support a component by surface engagement with said one surface thereof, and said blocks having restraining means spaced from said supporting surfaces and adapted to releasably engage leads of at least said first and said last rows at a point which is spaced from said one surface and disposed between said enlarged portion and the free ends of said leads to prevent motion of the component supported by said surfaces in the plane of said one surface in at least two directions.

16. A machine for inserting electrical components into a board, the design of said components being characterized by a body portion, one or more parallel rows of spaced leads extending from one surface of the body portion, and the first and last leads of the first and last of said rows of leads having an enlarged portion disposed adjacent said one surface for the purpose of spacing said one surface from said board in component inserted position, said machine including an inserter having a reciprocal component inserting means, means for reciprocating said inserting means, and a component supporting assembly adapted to support a component in position to permit said inserting means to pick up said component during reciprocation thereof, said assembly comprising: a mounting block; a pair of pivot blocks which are supported on spaced parallel pivot shafts extending from one face of said mounting block; said first abutment means carried on said mounting block; second abutment means carried on said pivot blocks; spring means, said spring means being adapted to bias said first and second abutments into engagement to normally maintain said pivot blocks in a component supporting position; a pair of supporting surfaces carried one on each of said pivot blocks, said supporting surfaces being adapted to supportingly engage said one surface of a component to be supported along at least opposed marginal edges thereof, said supporting surfaces being disposed in a laterally spaced-apart planar relationship when said pivot blocks are in said component supporting position; restraining means disposed on said pivot blocks and spaced from said supporting surfaces a distance at least equal to the distance between said lead enlarged portion and said one surface of said component, said restraining means being adapted to releasably engage leads of at least said first and last rows when said component is supported on said supporting surfaces to restrain motion of said supported component in at least two directions planar to said supporting surfaces; cam follower surfaces provided one on each of said pivot blocks; a reciprocating plunger supported by said mounting block; and cam means carried by said plunger, said cam means being adapted to operably engage said cam surfaces, said plunger being adapted to be reciprocated in a direction parallel to the axis of said pivot shafts after said supported component is picked up by said inserting means to move said cam means with respect to said cam surfaces, whereby upon reciprocation of said plunger, said pivot blocks are forced from said component supporting position against the bias of said spring means to permit said inserting means to pass between said pivot blocks to insert said picked-up component into said board.

17. In a machine for inserting electrical components into a board, the design of said components being characterized by a body portion in the form of a rectangular solid and one or more parallel rows of leads extending from one surface of said body portion, said one surface being elongated, relatively small, and having the relatively long edges thereof disposed parallel to said rows, said body portion having a dimension normal to said one surface which defines with said long edges relatively large side surfaces, the provision of an inserter having a reciprocal component inserting means, means for reciprocating said inserting means, and a component supporting assembly adapted to supportably engage said one surface of a component to be inserted in a predetermined position with respect to said inserting means to permit said inserting means to pick up said component during reciprocation thereof, wherein said inserting means comprises, in part, a vertically reciprocating tube; a component pick up head disposed at the lower end of said tube, said pick up head being provided at the lower end thereof with a vertically extending side recess defined by a horizontally disposed top wall and a vertically disposed side wall, said side wall having a vertical dimension which is not greater than the dimension of said body portion normal to said one surface; an orifice provided in said side wall; and a vertically extending passageway provided within the said tube and said head, said passageway being connected at its lower end with said orifice, said insertion means being adapted to be reciprocated downwardly to place said side wall in surface engagement with one of said relatively large side surfaces and said top wall in engagement with a body portion surface spaced from said one surface, and said passageway being adapted to be placed in communication with a source of vacuum when said body portion is engaged by said pick up head.

References Cited

UNITED STATES PATENTS

| | | | |
|---|---|---|---|
| 2,373,436 | 4/1945 | Treciokas ------ | 227—114 XR |
| 2,850,737 | 9/1958 | Walsh ------------- | 227—116 |
| 2,896,208 | 7/1959 | Alderman et al. ------ | 227—118 |
| 3,254,821 | 6/1966 | Ackerman et al. ---- | 227—119 |

WILLIAM W. DYER, Jr., *Primary Examiner.*

GRANVILLE Y. CUSTER, Jr., *Examiner.*